United States Patent
Fang et al.

(10) Patent No.: US 6,251,778 B1
(45) Date of Patent: Jun. 26, 2001

(54) METHOD FOR USING CMP PROCESS IN A SALICIDE PROCESS

(75) Inventors: Edberg Fang, Yunlin Hsien; T. C. Tsai; L. M. Liu, both of Hsinchu, all of (TW)

(73) Assignee: United Microelectronics Corporation (TW)

( * ) Notice: Subject to any disclaimer, the term of this patent is extended or adjusted under 35 U.S.C. 154(b) by 0 days.

(21) Appl. No.: 09/452,410

(22) Filed: Dec. 1, 1999

(30) Foreign Application Priority Data

Sep. 16, 1999 (TW) ............................................. 088115973

(51) Int. Cl.$^7$ .................................................. H01L 21/44
(52) U.S. Cl. .......................... 438/682; 438/682; 438/683; 438/684; 438/685; 438/584; 257/577; 257/763; 257/764; 257/770
(58) Field of Search .................................... 438/682, 684, 438/685, 683, 229, 230, 584; 257/577, 763–764, 770

(56) References Cited

U.S. PATENT DOCUMENTS

| | | | |
|---|---|---|---|
| 5,683,941 | * 11/1997 | Kao et al. | 437/200 |
| 5,770,507 | * 6/1998 | Chen et al. | 438/305 |
| 5,817,562 | * 10/1998 | Chang et al. | 438/305 |
| 5,824,588 | * 10/1999 | Liu | 438/302 |
| 5,904,533 | * 5/1999 | Lin | 438/299 |
| 5,953,614 | * 9/1999 | Liu et al. | 438/303 |
| 5,985,768 | * 11/1999 | Speranza et al. | 438/783 |
| 6,001,721 | * 12/1999 | Huang | 438/597 |
| 6,013,569 | * 1/2000 | Lur et al. | 438/595 |
| 6,072,222 | * 6/2000 | Nistler | 257/383 |
| 6,074,921 | * 6/2000 | Lin | 438/299 |
| 9,084,280 | * 10/1998 | Gardner et al. | 257/412 |

\* cited by examiner

*Primary Examiner*—Matthew Smith
*Assistant Examiner*—Granvill Lee, Jr.
(74) *Attorney, Agent, or Firm*—Fish & Richardson P.C.

(57) ABSTRACT

A method for using CMP processes in the salicide process for preventing bridging. Beginning with a semiconductor substrate with active regions defined completely by field oxide, the following steps are perfromed: forming a gate electrode and spaced lightly doped source and drain regions, the gate electrode comprising a gate oxide layer and a conducting gate; forming a hard mask layer on the gate electrode; forming spacers on sidewalls of the hard mask layer and the gate electrode, wherein the material used for the spacers is different from the material used for the hard mask layer; implanting ions into the substrate to form highly doped source and drain regions; removing the hard mask layer such that an opening is formed; conformally forming a metal layer on the source and drain regions, the spacers, and the conducting gate; forming an insulating layer on the metal layer and filling the opening, wherein the material of the insulating layer is different from the material of the spacers; polishing to remove an upper portion of the insulating layer, the metal layer and the spacers, whereby the metal layer becomes discontinuous; removing a portion of the metal layer between the spacers and the insulating layer; removing the insulating layer; and converting the metal layer to a silicide layer.

20 Claims, 10 Drawing Sheets

METHOD FOR USING CMP PROCESS IN A SALICIDE PROCESS

BACKGROUND OF THE INVENTION

1. Field of the Invention

The present invention relates to a salicide process. More particularly, it relates to a method for using CMP processes in a salicide process to prevent bridging.

2. Description of the Prior Art

Because of the increasing complexity of electronic devices, the dimensions of MOS devices are shrinking, and the source (drain) resistance is increasing to the level of the channel. In order to lower the source (drain) resistance and keep the shallow junction between the metal and MOS intact, the self-aligned silicide process is widely applied in fabricating VLSI under 0.5 µm. Such a process is also called a salicide process.

Titanium is a metal which is capable of reacting with oxygen. Under adequate temperature, titanium easily reacts with silicon to form a compound called $TiSi_2$ with lower resistance by inter-diffusion. Thus, there is good ohmic contact formed between the interface of titanium and silicon. Presently, titanium is the most popular metal used for the salicide process (Co and Pt are alternatives). FIGS. 1A through 1E illustrate, in cross section, the conventional salicide process.

Referring to FIG. 1A, a basic MOS structure is formed on a semiconductor substrate 10. The MOS structure includes a defined polysilicon gate 14, a thin gate oxide 12, source/drain active regions 16, spacers 20 formed by chemical vapor deposition (CVD), and field oxide 11. After cleaning the wafer in a hydrofluoric acid solution to remove all possible contamination, titanium is sputtered, for example by DC magnetron sputtering, to deposit a titanium layer 30 of a thickness between 200 and 1000 Å over the MOS structure, as shown in FIG. 1B.

Then, the first rapid thermal process, RTP, is performed at between 650 and 800° C. and with a nitrogen gas ($N_2$) ambient. During the annealing step, titanium reacts with the polysilicon on the gate 14 and the crystalline silicon of the source/drain active regions and forms $TiSi_2$ (C49 phase) layers 31, however, the titanium on the spacer 20 and the field oxide 11 remain intact, as FIG. 1C illustrates.

Next, selective etching involving two consecutive wet etchings is used to remove the intact titanium layers. The first etching utilizes a mixture of $NH_4OH$, $H_2O_2$, and $H_2O$ as the etchant, while the second etching utilizes a mixture of $H_2SO_4$ and $H_2O_2$ as the etchant. The wet etching dissolves the titanium and titanium nitride layer 30 but does not etch the $TiSi_2$ layers 31. All the titanium and titanium nitride layers 30 on field oxide 11 and spacer 20 are removed, while the $TiSi_2$ layers are still left on the polysilicon gate 14 and the source/drain active regions 16, as FIG. 1D illustrates.

Then, the second RTP is performed at about 800–900° C. with a pressure 760 mtorr and with a nitrogen gas ($N_2$) ambient. During the annealing step, the $TiSi_2$ layers 31 of C49 phase are transformed to the $TiSi_2$ layers 32 of C54 phase, as FIG. 1E illustrates. However, the salicide process according to the prior art has the disadvantages described as follows.

In the titanium salicide process, after HF cleaning, titanium is deposited on wafer in a sputter system. During the first RTP, silicon in the poly gate and source/drain area diffuses into titanium layer and reacts with titanium to form C49-$TiSi_2$. However, if excess silicon diffuses across the spacer region to form silicide (in this example, $TiSi_2$) on top of the spacer, it cannot be removed by selective etching; consequently, the gate and drain/source area become "bridged" together, resulting in a circuit short. As devices become smaller, the spacer width needs to be reduced correspondingly, and thus the distance between the poly gate and source/drain decreases, thereby increasing the possibility of bridging.

In addition, there is a parasitic capacitor between the polysilicon gate and drain/source, wherein the spacer is one dielectric of the parasitic capacitor. While scaling down the devices, the thickness of the spacer is scaled down too, and the parasitic capacitance is increased, such that the operation rate is slowed down due to the large parasitic capacitance.

SUMMARY OF THE INVENTION

Accordingly, an objective of the present invention is to provide a method for using CMP processes in the salicide process to overcome bridging. The bridging between gate and drain/source in the salicide process can be prevented by applying the CMP and the resulting structures according to the present invention.

According to the present invention, a method of fabricating a semiconductor device, includes the steps: (a) providing a semiconductor substrate having a gate electrode and spaced lightly doped source and drain regions, the gate electrode comprising a gate oxide layer and a conducting gate; (b) forming a hard mask layer on the gate electrode; (c) forming spacers on sidewalls of the hard mask layer and the gate electrode, wherein the material used for the spacers is different from the material used for the hard mask layer; (d) implanting ions into the substrate to form highly doped source and drain regions; (e) removing the hard mask layer such that an opening is formed; (f) conformally forming a metal layer on the source and drain regions, the spacers, and the conducting gate; (g) forming an insulating layer on the metal layer and filling the opening, wherein the material of the insulating layer is different from the material of the spacers; (h) polishing to remove an upper portion of the insulating layer, the metal layer and the spacers, whereby the metal layer becomes discontinuous; (i) removing a portion of the metal layer between the spacers and the insulating layer; (j) removing the insulating layer; and (k) converting the metal layer to a silicide layer.

Referring to FIG. 2I, an upper end of a spacer is polished off to remove an electrically conductive Ti layer which has been formed thereon. Thereafter, a titanium film and a silicon film are caused to react with each other to produce a $TiSi_2$ layer of silicide.

Since the conductive layer responsible for the short circuit between the gate electrode and the source-drain region is removed, the bridging between gate and drain/source in the salicide process can be prevented.

According to the present invention, another method of fabricating a semiconductor device, includes the steps: (a) providing a semiconductor substrate having a gate electrode and spaced lightly doped source and drain regions, the gate electrode comprising a gate oxide layer and a conducting gate; (b) forming a hard mask layer on the gate electrode; (c) forming spacers on sidewalls of the hard mask layer and the gate electrode, wherein the material used for the spacers is different from the material used for the hard mask layer; (d) implanting ions into the substrate to form highly doped source and drain regions; (e) removing the hard mask layer such that an opening is formed; (f) conformally forming a metal layer on the source and drain regions, the spacers, and the conducting gate; (g) converting the metal layer to a silicide layer;(h) forming an insulating layer on silicide layer and filling the opening; and(i) polishing to remove an upper portion of the insulating layer, the silicide layer and the spacers, whereby the silicide layer becomes discontinuous.

Referring to FIG. 3C, an upper end of a spacer is polished off to remove an electrically conductive $TiSi_2$ layer which has been formed on the upper end of the spacer.

Since the conductive layer responsible for the short circuit between the gate electrode and the source-drain region is removed, the bridging between gate and drain/source in the salicide process can be prevented.

According to the present invention, another method of fabricating a semiconductor device, includes the steps: (a) providing a semiconductor substrate having a gate electrode and spaced lightly doped source and drain regions, the gate electrode comprising a gate oxide layer and a conducting gate; (b) forming a hard mask layer on the gate electrode; (c) forming spacers on sidewalls of the hard mask layer and the gate electrode, wherein the material used for the spacers is different from the material used for the hard mask layer; (d) implanting ions into the substrate to form highly doped source and drain regions; (e) removing the hard mask layer such that an opening is formed; (f) conformally forming a metal layer on the source and drain regions, the spacers, and the conducting gate; (g) converting the metal layer to a silicide layer; (h) forming a first insulating layer on the silicide layer and filling the opening; (i) forming a second insulating layer on the first insulating layer, wherein the material of the second insulating layer is different from the material of the first insulating layer; and(j) polishing to remove an upper portion of the first insulating layer, the second insulating layer, the silicide layer and the spacers, whereby the silicide layer becomes discontinuous.

Referring to FIG. 4B, an upper end of a spacer is polished off to remove an electrically conductive $TiSi_2$ layer which has been formed thereon.

Since the conductive layer responsible for the short circuit between the gate electrode and the source-drain region is removed, the bridging between gate and drain/source in the salicide process can be prevented.

The steps, advantages, and features of the present invention are further described as follows by embodiments accompanying the drawings.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a method for using CMP processes in the salicide process to overcome bridging. The present invention will be described in detail with reference to the accompanying drawings.

Embodiment 1

Figure 1A:
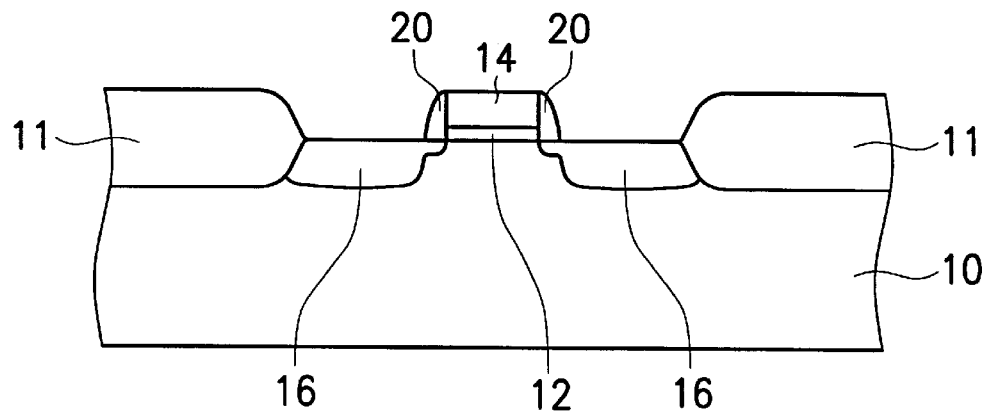
FIGS. 1A through 1E illustrate, in cross section, the process steps according to the prior art.
Figure 1B:
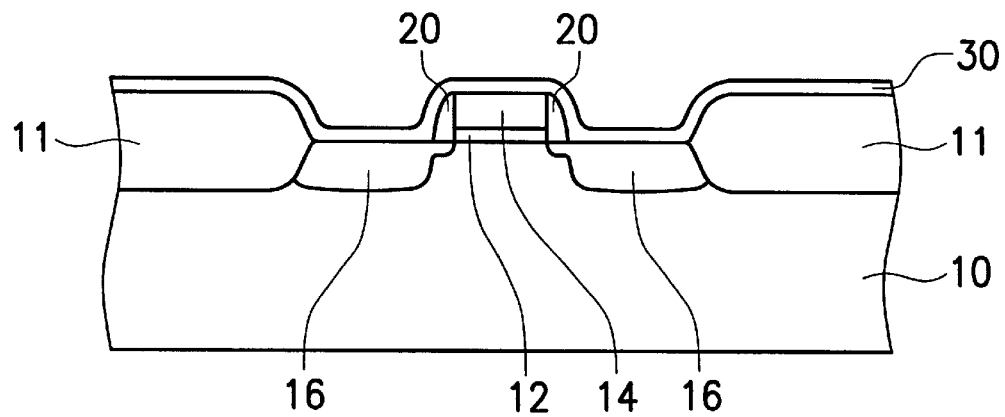
Figure 1C:
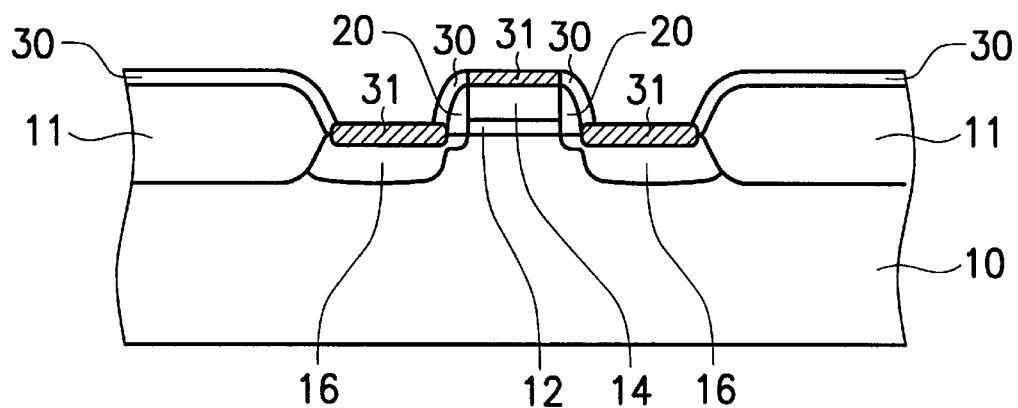
Figure 1D:
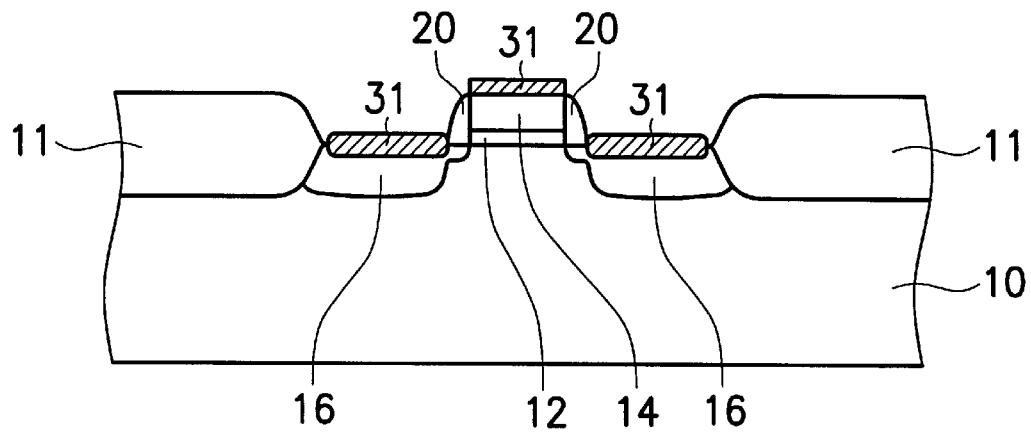
Figure 1E:
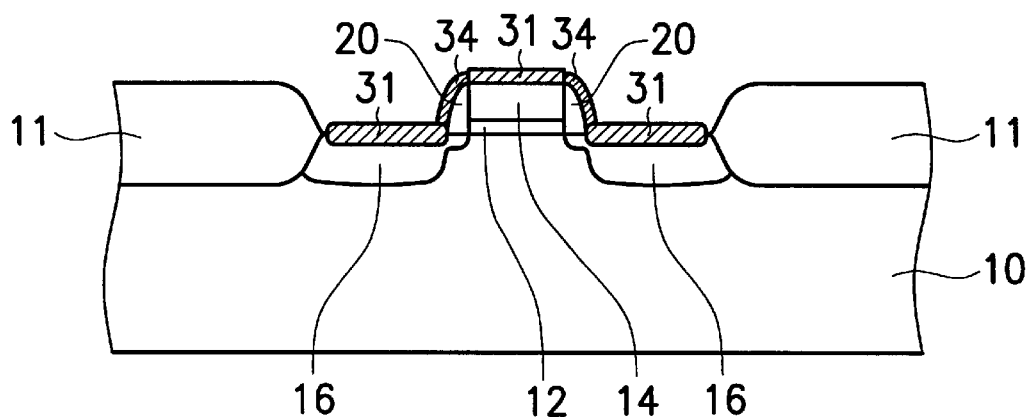
Figure 2A:
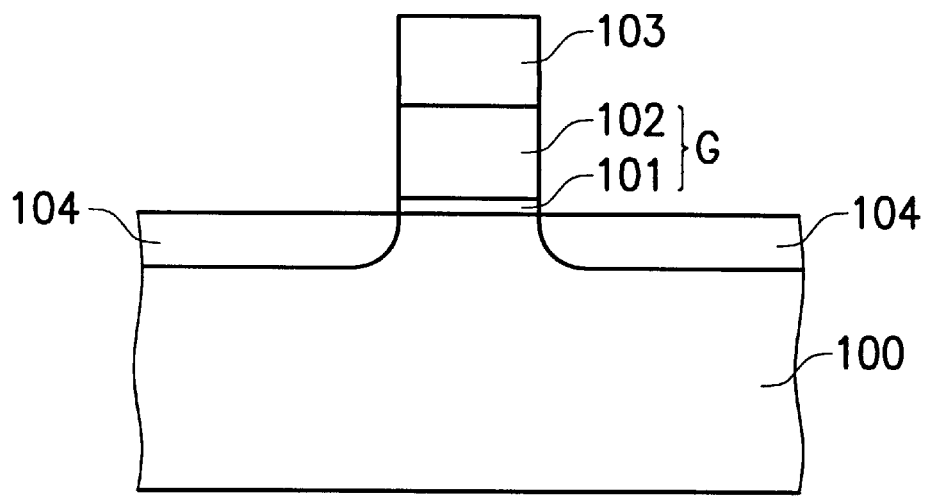
FIGS. 2A through 2I illustrate, in cross section, the process of embodiment 1 according to the present invention.

This embodiment begins by providing a semiconductor substrate 100 having a gate electrode G and spaced lightly doped source and drain regions 104. The gate electrode is comprised of a gate oxide layer 101 and a conducting gate 102 (polysilicon gate) as shown in FIG. 2A. The gate oxide layer 101 is preferably formed of silicon oxide. The conducting gate 102 is preferably formed of polysilicon.

Next, a dielectric hard mask layer is formed on the gate electrode. The hard mask layer 103 preferably has a thickness in the range of between about 1000 and 2000 Å. The hard mask layer 103 is preferably formed of silicon oxide by a CVD process.

Figure 2B:
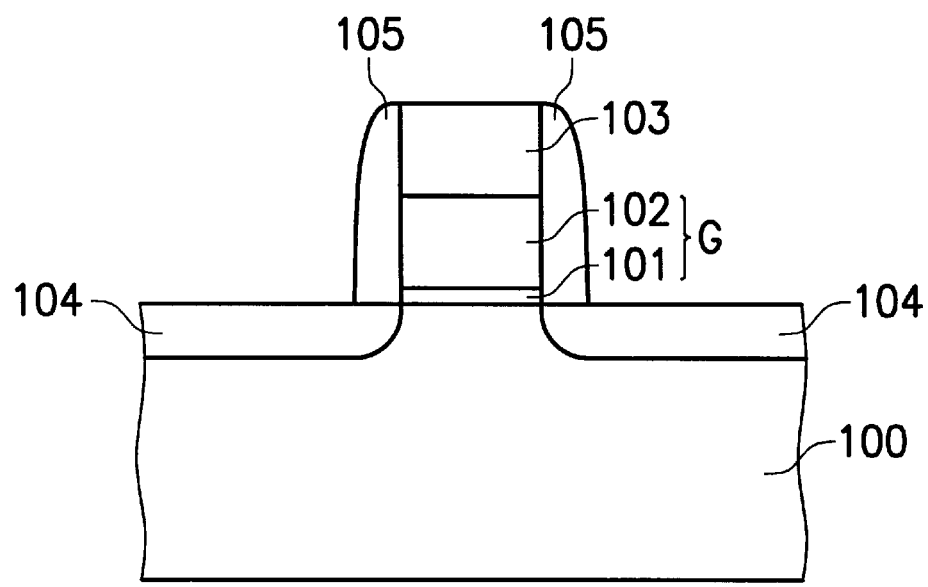

Referring to FIG. 2B, an insulating layer composed of a different material from the hard mask layer 103, such as a silicon nitride layer, of 1000~1500 Å thickness is deposited over the substrate. It is important that the insulating layer and hard mask layer have different etching characteristics. Then, the nitride layer is etched anisotropically such that only the nitride layer of a thickness less than 1000~1500 Å remains on the sidewalls of the gate electrode G and the hard mask layer 103, and acts as spacers 105. Therefore, the spacers 105 have a height over the gate electrode G in the range of between about 0.1 and 0.2 μm.

Figure 2C:
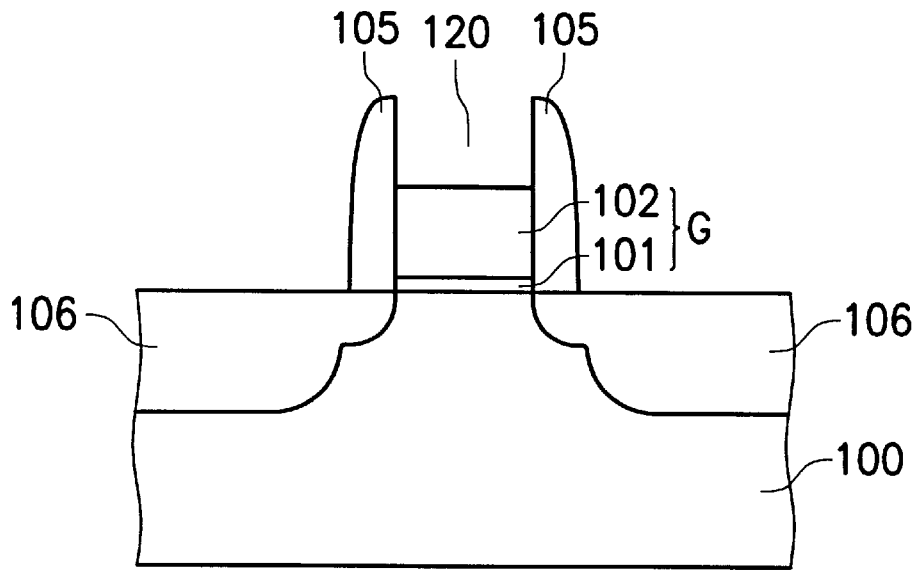

The drain/source regions 106 are formed by ion implantation. The result is shown in FIG. 2C. Then, the hard mask layer 103 is etched-back to reveal the gate, using an anisotropical dry etching or an anisotropical etching process, and thus an opening 120 exists between a portion of the inside wall of the spacers 105 and the surface of the conducting gate 102.

Figure 2D:
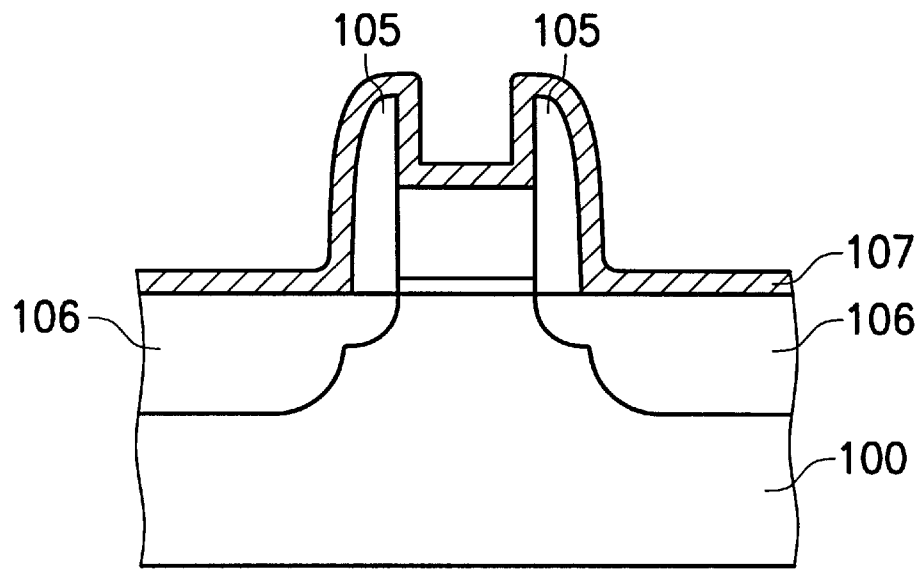

As shown in FIG. 2D, a metal layer 107 is formed conformally by DC magnetron sputtering over the source and drain regions 106, the spacers 105 and the gate electrode G. Titanium is the most popular metal used for the salicide process (Co and Pt are alternatives). Under adequate temperature, titanium easily reacts with silicon to form a compound called $TiSi_2$ with low resistance by interdiffusion. Thus, a good ohmic contact is formed between the interface of titanium and silicon.

Figure 2E:
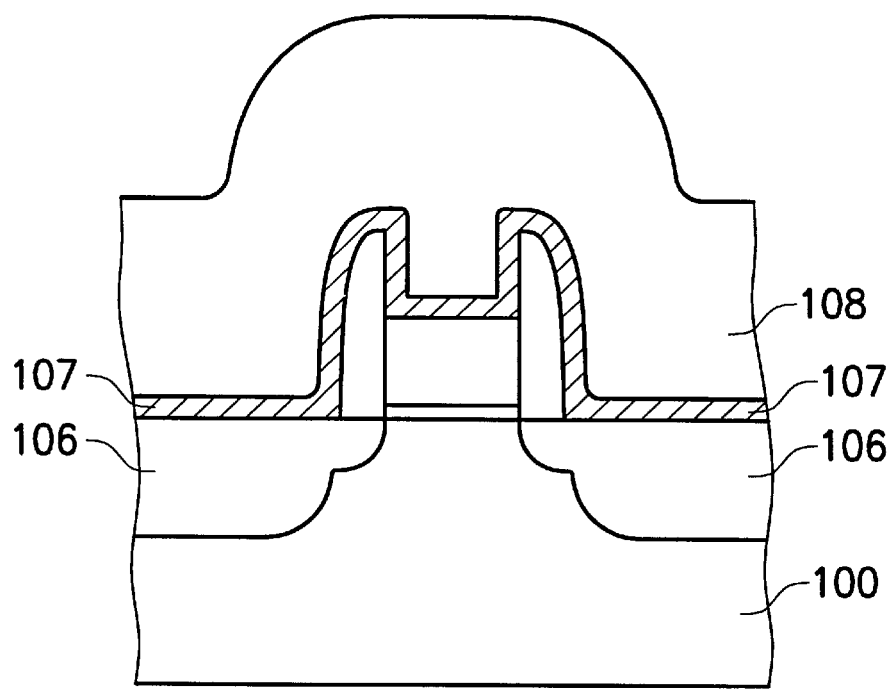

Referring to FIG. 2E, an inter layer dielectric (ILD) composed of a different material from the insulating layer, such as a silicon oxide layer 108, of 3000–8000 Å thickness is deposited over the metal layer 107 and fills the opening 120.

Figure 2F:
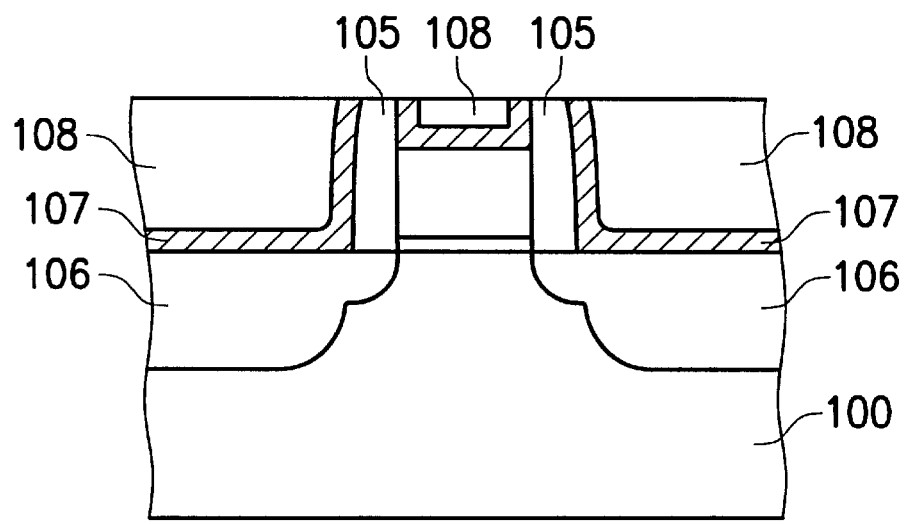

CMP (Chemical Mechanical Planarization) is used to polish off an upper portion of the ILD layer 108, the metal layer 107 and the spacers 105, whereby the metal layer becomes discontinuous. These can be achieved by adjusting the processing parameters, such as platen speeds, back pressure, pad types, and slurry types, to meet the requirements for removal rate, uniformity, and selectivity, which are needed in the process. The result is shown in FIG. 2F.

Figure 2G:
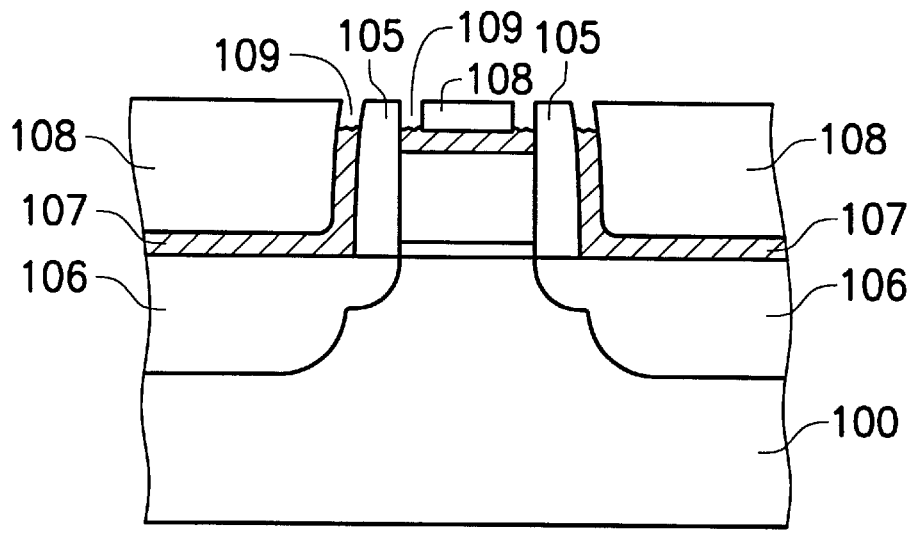
Figure 2H:
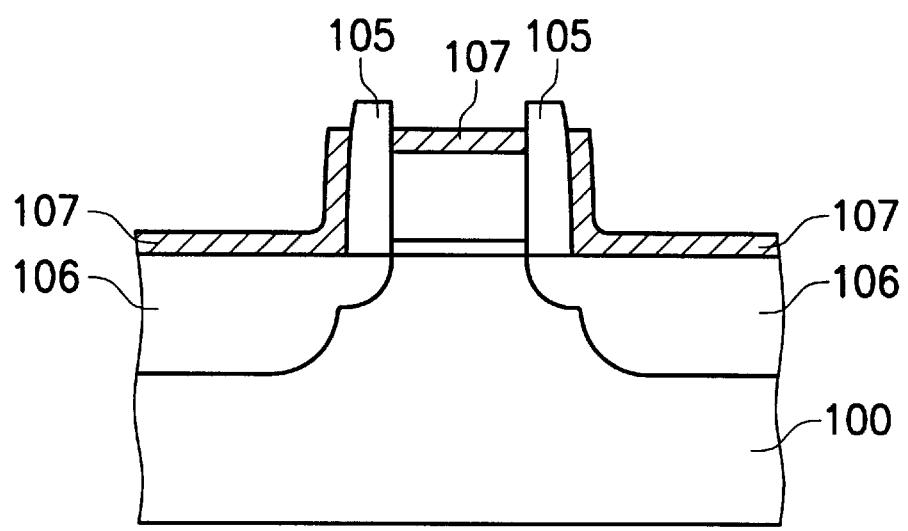

Next, a portion of metal layer 107 between the spacers 105 and the insulating layer 108 is removed by wet etching. The result is illustrated in FIG. 2G, whereby gaps 109 exist between the spacers 105 and the insulating layer 108. Referring to FIG. 2H, the insulating layer 108 is anisotropically etched by reactive ion etching, exposing the metal layer 107.

Figure 2I:
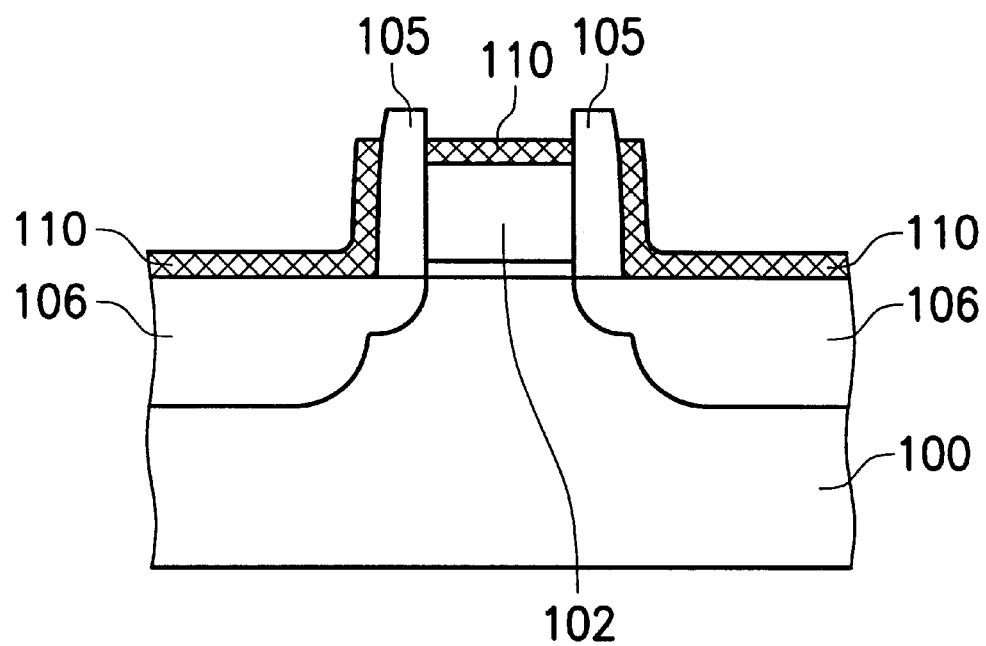

Then, the metal layer 107 is converted to a silicide layer 110. For example, the first rapid thermal process, RTP, is performed at between 600° C. and 800° C. and with a nitrogen gas (N$_2$) ambient. During the annealing step, titanium layer 107 reacts with the polysilicon on the gate 102 and the crystalline silicon of the drain/source regions 106, and forms TiSi$_2$ layers 110; however, there is residual unreacted titanium (not shown) over the spacers 105. The result is illustrated in FIG. 2I. Next, a mixture of NH$_4$OH, H$_2$O$_2$, and H$_2$O are used as the etchant to selectively wet etch the residual titanium layer. The wet etching dissolves the residual titanium layer but does not etch the TiSi$_2$ layers.

Then, the second RTP is performed at between 800° C. and 900° C. and with a nitrogen gas (N$_2$) ambient. By this annealing step, the resistivity of the TiSi$_2$ can be lowered.

Embodiment 2

Referring to FIGS. 2A to 2D and 3A to 3C, the second embodiment of the invention is illustrated. First, referring to FIGS. 2A to 2D, the same processes and steps as those in the first embodiment, wherein each part with the same denotation possesses the same function.

Figure 3A:
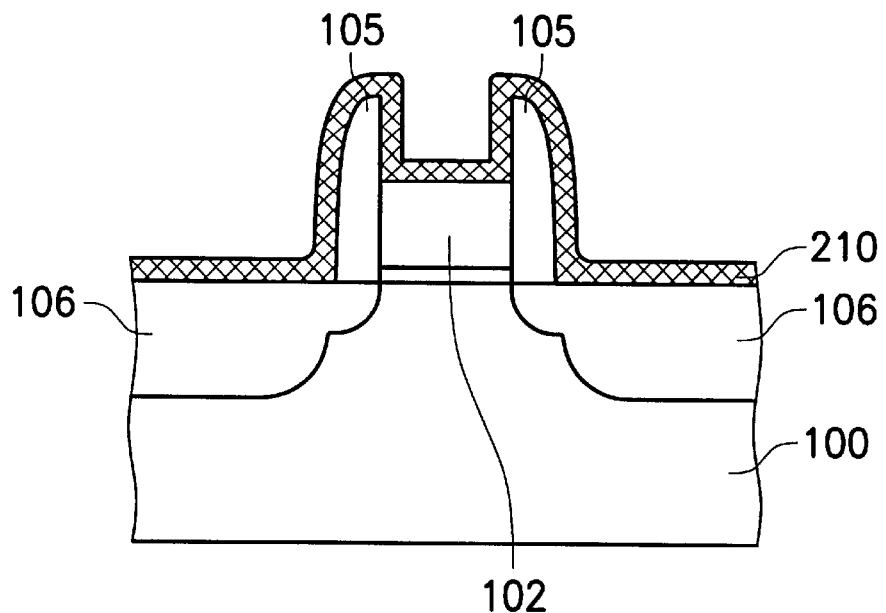
FIGS. 3A through 3C illustrate, in cross section, the process of embodiment 2 according to the present invention.

Next, the metal layer 107 is converted to a silicide layer 210. For example, the first rapid thermal process, RTP, is performed at between 600° C. and 800° C. and with a nitrogen gas (N$_2$) ambient. During the annealing step, titanium layer 107 reacts with the polysilicon on the conducting gate 102 and the crystalline silicon of the drain/source regions 106, and forms TiSi$_2$ layer 210; however, there is residual unreacted titanium (not shown) over the spacers 105. The result is illustrated in FIG. 3A. Next, a mixture of NH$_4$OH, H$_2$O$_2$, and H$_2$O are used as the etchant to selectively wet etch the residual titanium layer. The wet etching dissolves the residual titanium layer but does not etch the TiSi$_2$ layers.

Then, the second RTP is performed at between 800° C. and 900° C., at a pressure of 760 mtorr and with a nitrogen gas (N$_2$) ambient. By this annealing step, the resistivity of the TiSi$_2$ can be lowered.

Figure 3B:
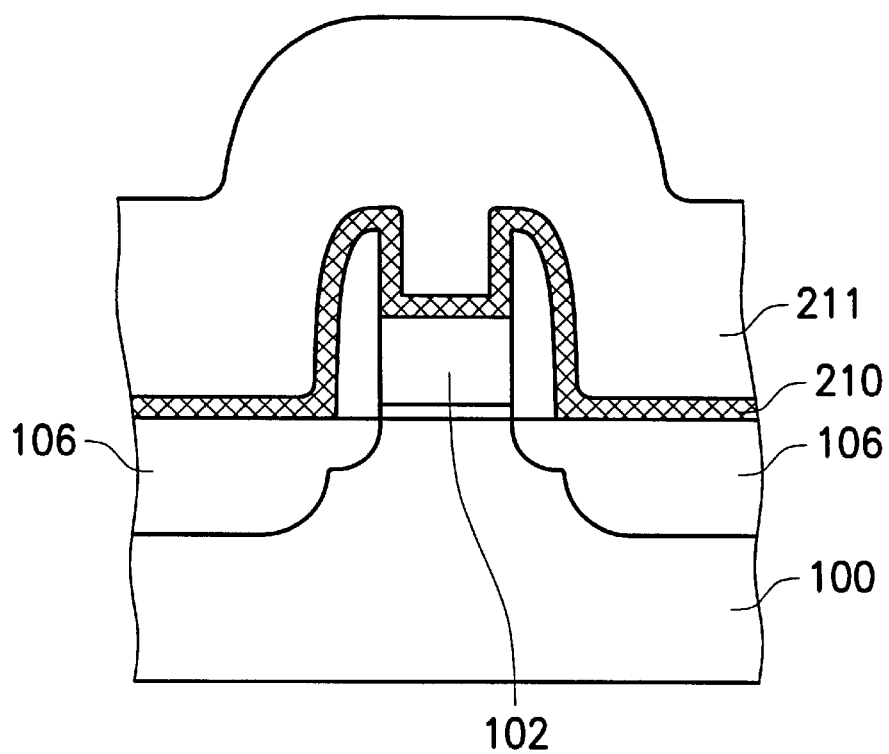

Referring to FIG. 3B, an inter layer dielectric (ILD) such as a silicon oxide layer 211, of 3000~8000 Å thickness is deposited over the TiSi$_2$ layer 210 and fills the opening 120.

Figure 3C:
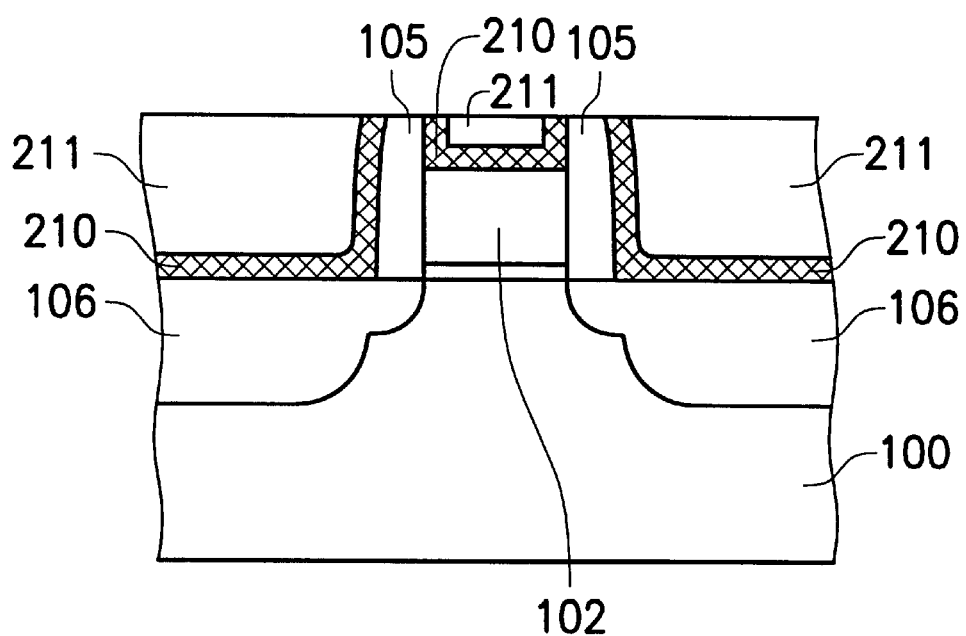

The CMP is used to polish off an upper portion of the ILD layer 211, the TiSi$_2$ layer 210 and the spacers 105, whereby the conductive layer becomes discontinuous. This can be achieved by adjusting the processing parameters, such as platen speeds, back pressure, pad types, and slurry types, to meet the requirements for removal rate, uniformity, and selectivity, which are needed in the process. The result is shown in FIG. 3C.

Embodiment 3

Referring to FIGS. 2A to 2D, 3A and 4A to 4B, the third embodiment of the invention is illustrated. First, referring to FIGS. 2A to 2D and 3A, the same processes and steps as the Embodiment 2 are performed, wherein each part with the same denotation possesses the same function.

Figure 4A:
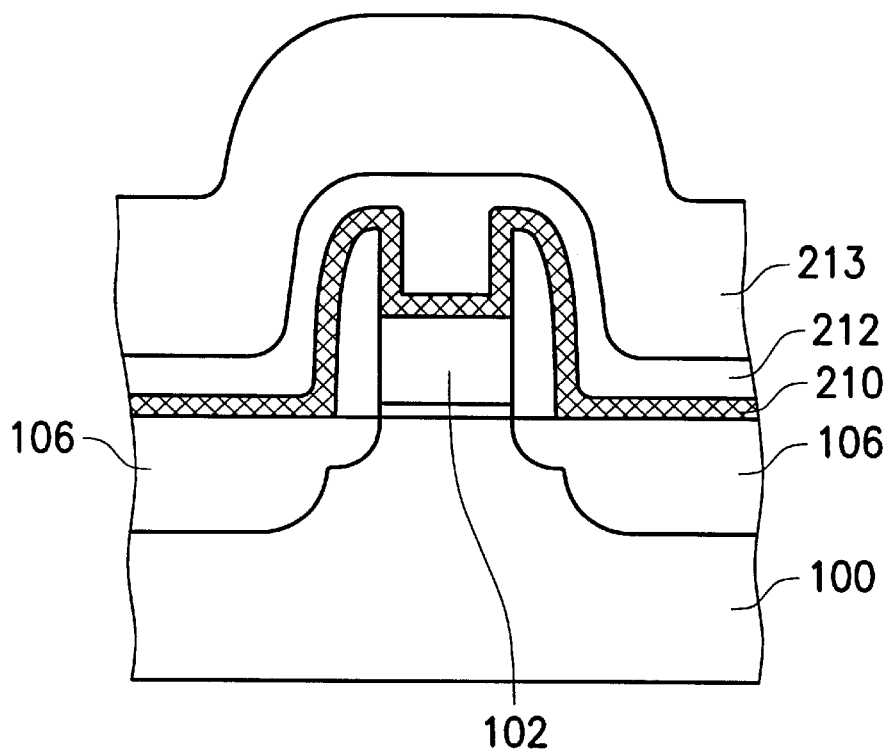
FIGS. 4A through 4B illustrate, in cross section, the process of embodiment 3 according to the present invention.

Referring to FIG. 4A, two insulating layers are formed on the TiSi$_2$ layer 210. First, a silicon nitride layer 212, of 1000~3000 Å thickness is deposited over the TiSi$_2$ layer 210 and fills the opening 120. Next, a silicon oxide layer 213 of 3000–8000 Å thickness is deposited on the silicon nitride layer 212. The silicon nitride layer 212 serves as a stop layer of the CMP process, and the silicon oxide layer 213 serves as a ILD layer.

Figure 4B:
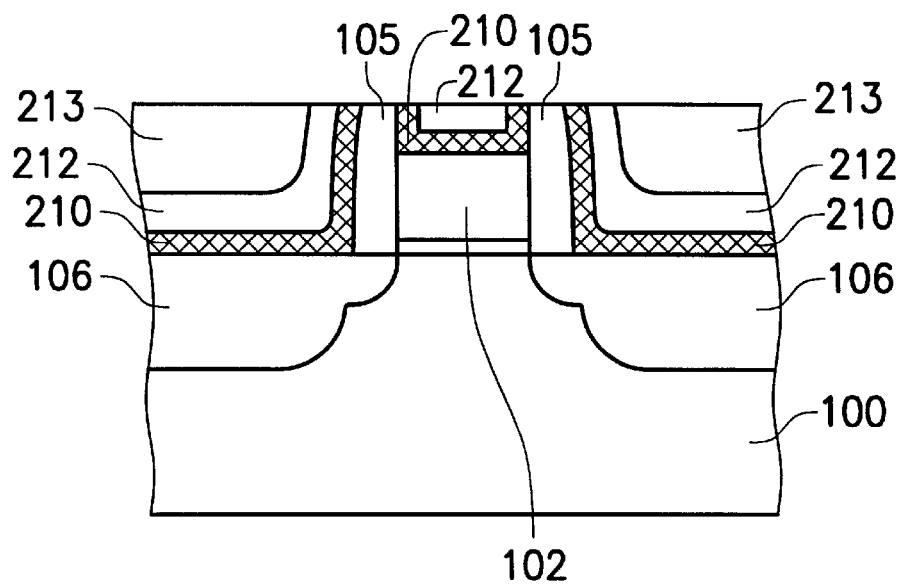

The CMP is used to polish off an upper portion of the ILD layer 213, the stop layer 212, the TiSi$_2$ layer 210 and the spacers 105, whereby the conductive layer becomes discontinuous. These can be achieved by adjusting the processing parameters, such as platen speeds, back pressure, pad types, and slurry types, to meet the requirements for removal rate, uniformity, and selectivity, which are needed in the process. The result is shown in FIG. 4B.

This invention provides some benefits over conventional processes. Based on the embodiments described above, an upper end of a spacer is polished off to remove an electrically conductive layer. Therefore, the probability for the silicon to diffuse across the spacer is reduced, and bridging (or a short circuit) between the gate and drain/source regions is prevented.

While the invention has been particularly shown and described with the reference to the preferred embodiments thereof, it will be understood by those skilled in the art that various changes in form and details may be made without departing from the spirit and scope of the invention.

What is claimed is:

1. A method of fabricating a semiconductor device, comprising the steps of:
    (a) providing a semiconductor substrate having a gate electrode and spaced lightly doped source and drain regions, said gate electrode comprising a gate oxide layer and a conducting gate;
    (b) forming a hard mask layer on said gate electrode;
    (c) forming spacers on sidewalls of said hard mask layer and said gate electrode, wherein the material used for said spacers is different from the material used for said hard mask layer;
    (d) implanting ions into said substrate to form highly doped source and drain regions;
    (e) removing said hard mask layer such that an opening is formed;
    (f) conformally forming a metal layer on said source and drain regions, said spacers, and said conducting gate;
    (g) forming an insulating layer on said metal layer and filling said opening, wherein the material of said insulating layer is different from the material of said spacers;
    (h) polishing to remove an upper portion of said insulating layer, said metal layer and said spacers, whereby said metal layer becomes discontinuous;
    (i) removing a portion of said metal layer between said spacers and said insulating layer;
    (j) removing said insulating layer; and
    (k) converting said metal layer to a silicide layer.

2. The method of claim 1 wherein said hard mask layer has a thickness in a range of about 1000~2000 Å.

3. The method of claim 1 wherein said spacers have a height over said gate electrode in the range of about 0.1~0.2 μm.

4. The method of claim 1 wherein the removing of said hard mask layer is performed by etching-back said hard mask layer with anisotropic etching process.

5. The method of claim 1 wherein said metal layer is composed of titanium.

6. The method of claim 1 wherein said insulating layer is composed of silicon oxide and has a thickness in a range of about 3000~8000 Å.

7. The method of claim 1 wherein the removing of a portion of said metal layer between said spacers and said insulating layer is performed by wet etching.

8. A method of fabricating a semiconductor device, comprising the steps of:
    (a) providing a semiconductor substrate having a gate electrode and spaced lightly doped source and drain regions, said gate electrode comprising a gate oxide layer and a conducting gate;

(b) forming a hard mask layer on said gate electrode;

(c) forming spacers on sidewalls of said hard mask layer and said gate electrode, wherein the material used for said spacers is different from the material used for said hard mask layer;

(d) implanting ions into said substrate to form highly doped source and drain regions;

(e) removing said hard mask layer such that an opening is formed;

(f) conformally forming a metal layer on said source and drain regions, said spacers, and said conducting gate;

(g) converting said metal layer to a silicide layer;

(h) forming an insulating layer on silicide layer and filling said opening; and (i) polishing to remove an upper portion of said insulating layer, said silicide layer and said spacers, whereby said silicide layer becomes discontinuous.

9. The method of claim 8 wherein said hard mask layer has a thickness in a range of about 1000~2000 Å.

10. The method of claim 8 wherein said spacers have a height over said gate electrode in the range of about 0.1~0.2 μm.

11. The method of claim 8 wherein the removing of said hard mask layer is performed by etching back said hard mask layer with anisotropic etching.

12. The method of claim 8 wherein said metal layer is composed of titanium.

13. The method of claim 8 wherein said insulating layer is composed of silicon oxide and has a thickness in a range of about 3000~8000 Å.

14. A method of fabricating a semiconductor device, comprising the steps of:

(a) providing a semiconductor substrate having a gate electrode and spaced lightly doped source and drain regions, said gate electrode comprising a gate oxide layer and a conducting gate;

(b) forming a hard mask layer on said gate electrode;

(c) forming spacers on sidewalls of said hard mask layer and said gate electrode, wherein the material used for said spacers is different from the material used for said hard mask layer;

(d) implanting ions into said substrate to form highly doped source and drain regions;

(e) removing said hard mask layer such that an opening is formed;

(f) conformally forming a metal layer on said source and drain regions, said spacers, and said conducting gate;

(g) converting said metal layer to a silicide layer;

(h) forming a first insulating layer on said silicide layer and filling said opening;

(i) forming a second insulating layer on said first insulating layer, wherein the material of said second insulating layer is different from the material of said first insulating layer; and (j) polishing to remove an upper portion of said first insulating layer, said second insulating layer, said silicide layer and said spacers, whereby said silicide layer becomes discontinuous.

15. The method of claim 14 wherein said hard mask layer has a thickness in a range of about 1000~2000 Å.

16. The method of claim 14 wherein said spacers have a height over said gate electrode in the range of about 0.1~0.2 μm.

17. The method of claim 14 wherein the removing of said hard mask layer is performed by etching back said hard mask layer with anisotropically etching.

18. The method of claim 14 wherein said metal layer is composed of titanium.

19. The method of claim 14 wherein said first insulating layer is composed of silicon nitride and has a thickness in a range of about 1000~3000 Å.

20. The method of claim 14 wherein said second insulating layer is composed of silicon oxide and has a thickness in a range of about 3000~8000 Å.

* * * * *